United States Patent [19]

Esterberg et al.

[11] Patent Number: 5,566,048

[45] Date of Patent: Oct. 15, 1996

[54] HINGE ASSEMBLY FOR A DEVICE HAVING A DISPLAY

[75] Inventors: Dennis R. Esterberg, Philomath; Mark A. Smith, Corvallis, both of Oreg.

[73] Assignee: Hewlett-Packard Company, Palo Alto, Calif.

[21] Appl. No.: 253,048

[22] Filed: Jun. 2, 1994

[51] Int. Cl.⁶ ............................. G06F 1/16; H05K 7/16; E05D 11/08

[52] U.S. Cl. ............... 361/681; 16/307; 16/342; 403/146

[58] Field of Search .............. 364/708.1; 16/306–308, 16/342; 403/119, 120, 146; 248/920, 922; 312/227.2; 361/681, 682

[56] References Cited

U.S. PATENT DOCUMENTS

| | | | |
|---|---|---|---|
| 4,944,481 | 7/1990 | Yurchenco et al. | 16/308 X |
| 4,976,007 | 12/1990 | Lam | 361/682 X |
| 4,986,763 | 1/1991 | Boyle | 361/681 X |
| 5,028,913 | 7/1991 | Kitamura | 16/306 X |
| 5,037,231 | 8/1991 | Kitamura | 16/308 X |
| 5,041,818 | 8/1991 | Liu | 16/306 X |
| 5,043,846 | 8/1991 | Kinoshita | 16/308 X |
| 5,077,551 | 12/1991 | Saitou | 16/306 X |
| 5,131,779 | 7/1992 | Sen | 16/342 X |
| 5,142,738 | 9/1992 | Ojima | 16/342 X |
| 5,144,290 | 9/1992 | Honda et al. | 16/306 X |
| 5,173,837 | 12/1992 | Blackwell et al. | 361/681 |
| 5,217,316 | 6/1993 | Ojima | 16/308 X |
| 5,240,319 | 8/1993 | Koga | 16/308 X |

OTHER PUBLICATIONS

Teague, "4 Views of a Blue–Ribbon Product," *Design News*, pp. 56–64, May 9, 1994.

*Primary Examiner*—Michael W. Phillips

[57] ABSTRACT

A hinge assembly allows a display housing to pivot relative to a portable computer base. The hinge assembly has a pivot shaft attached to the display housing and a spring. The spring has two ends. One end is attached to the display housing, and the other end is attached to the base. The spring counteracts the torque created by the weight of the display housing. This allows a smaller, lighter friction mechanism to be used to allow the display housing to remain in an open position at an angular orientation selected by the user. The hinge assembly further provides a mechanism for passing a wire harness through the hinge assembly, the wire harness providing electrical interconnection between the display and the computer base.

15 Claims, 9 Drawing Sheets

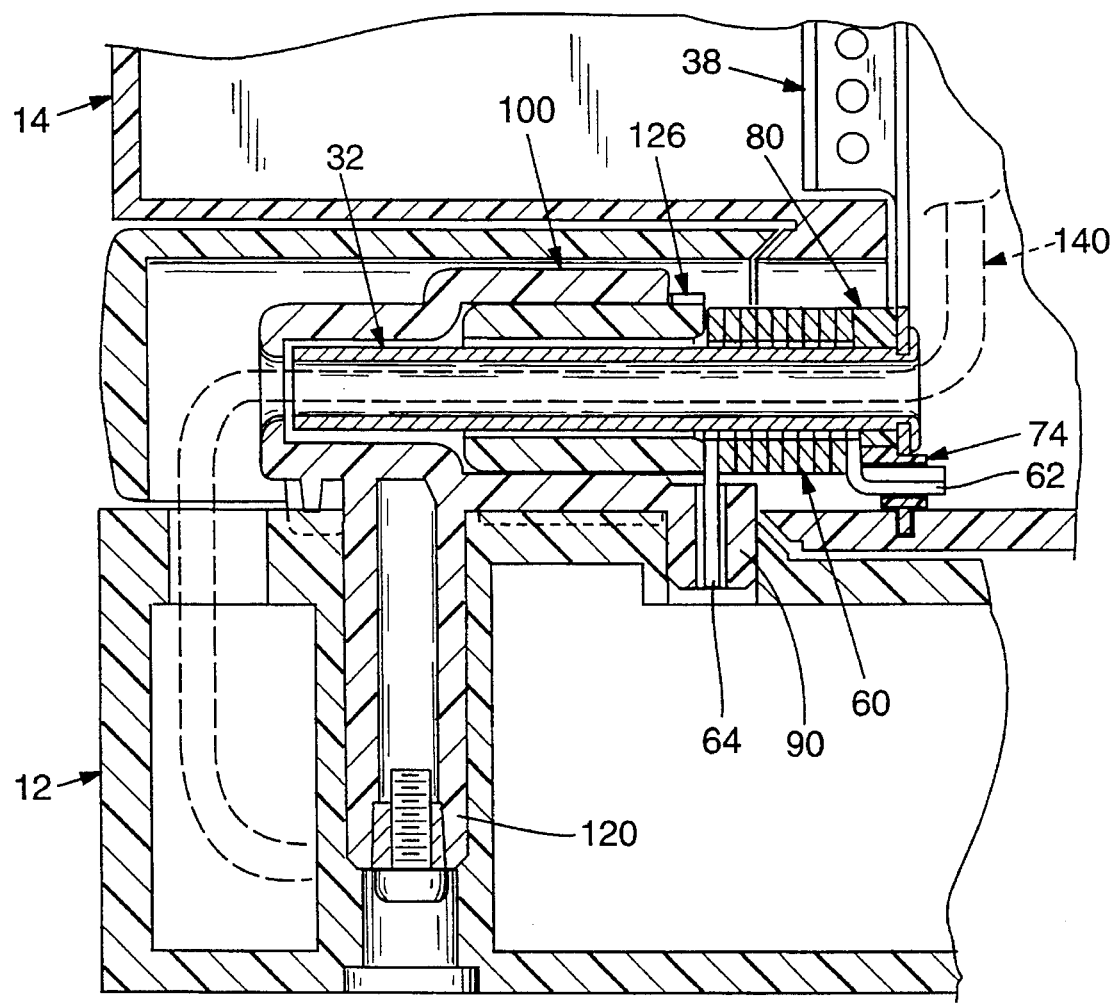

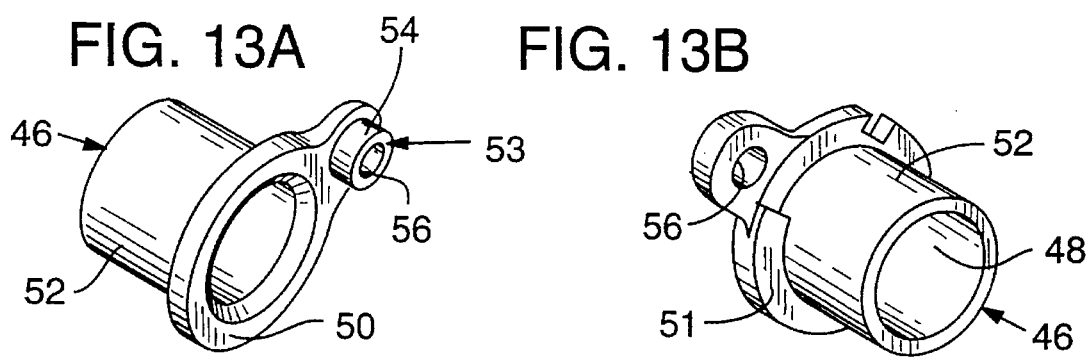
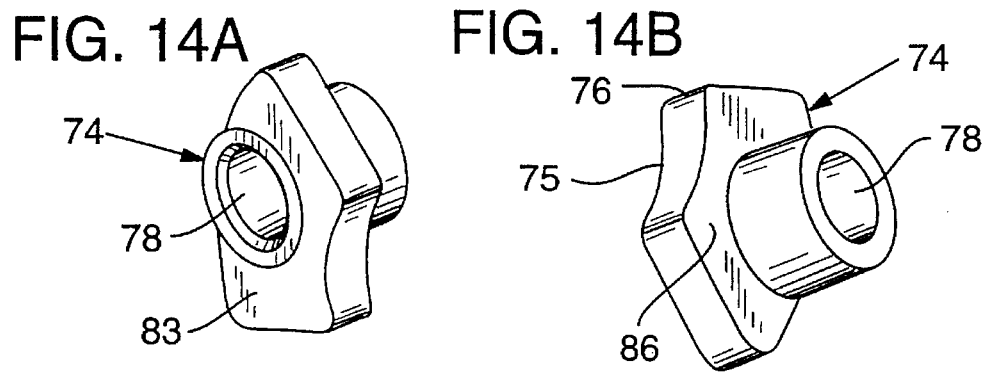
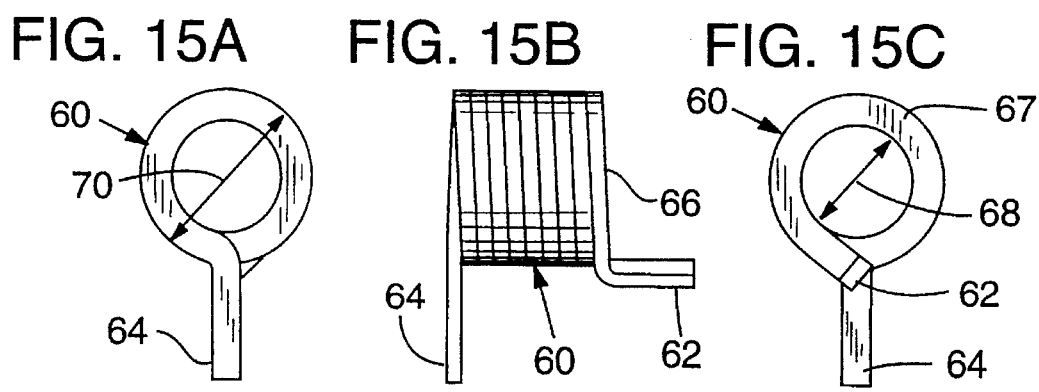
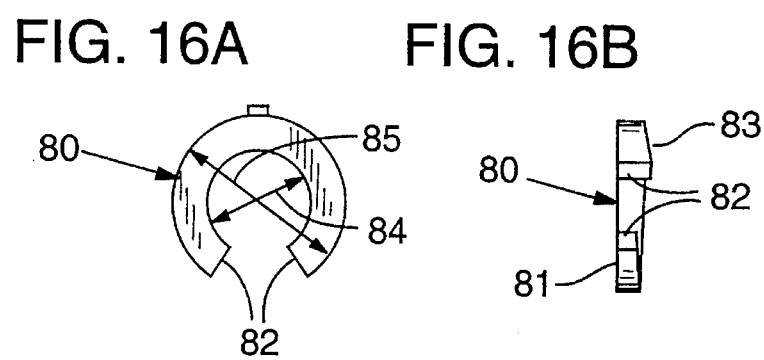

5,566,048

HINGE ASSEMBLY FOR A DEVICE HAVING A DISPLAY

FIELD OF INVENTION

The present invention relates to hinges used with devices having displays, such as portable computers.

BACKGROUND AND SUMMARY OF THE INVENTION

Portable computers, including those known as laptops, notebooks and palmtops, usually have a display screen housing that is hinged to a base part which carries the keyboard. The display housing is movable about the hinge(s) between a closed position against the base part and an open position with the display and keyboard exposed for use.

The hinges typically incorporate mechanisms that rely on friction to hold the display housing in the open position at the angle relative to the computer base preferred by the user.

The friction required by the hinge mechanism to support the weight of the display housing may be so great that two hands are required to open the computer. A user must use one hand to hold the base while using the other hand to pivot the display about the hinge. Furthermore, the display housing has a tendency to slam closed against the computer base.

In accordance with one aspect of the present invention, a hinge assembly for a device, such as a portable computer, is provided with a clutch mechanism that includes a friction component and a torsion spring component. The spring counteracts the weight of the display housing of the open computer. In this way, the friction component of the clutch mechanism need only be strong enough to support the open display housing during times when the computer is subjected to vibration or the like. This solution reduces the amount of force necessary to adjust the angular position of the display housing. One hand may be used to open and close the device. The reduced friction force allows use of a smaller, lighter friction component.

As another aspect of this invention, the weight-counteracting effect of the torsion spring tends to prevent the display from inadvertently or accidentally slamming closed against the base.

As another aspect of this invention, the pivot shaft has an inner surface of a sufficient diameter to allow a cable to pass through at least one of the hinge assemblies to carry electronic signals between the display and the base.

The foregoing and additional features and advantages of the invention will be more readily apparent from the following detailed description thereof, which proceeds with reference to the accompanying drawings.

BRIEF DESCRIPTION OF THE DRAWINGS

FIG. 8 is a sectional view illustrating the hinge assembly according to an embodiment of the present invention.

FIGS. 13A and 13B are views of a spring isolator according to the preferred embodiment of the present invention.

FIGS. 14A and 14B are views of a spring bushing according to an embodiment of the present invention.

FIG. 15A is a left end view of a torsion spring according to an embodiment of the present invention.

FIG. 15B is a side view of a torsion spring according to an embodiment of the present invention.

FIG. 15C is a right end view of a torsion spring according to an embodiment of the present invention.

FIG. 16A is an end view of a spring support according to an embodiment of the present invention.

FIG. 16B is a side view of a spring support according to an embodiment of the present invention.

DETAILED DESCRIPTION

Figure 1:
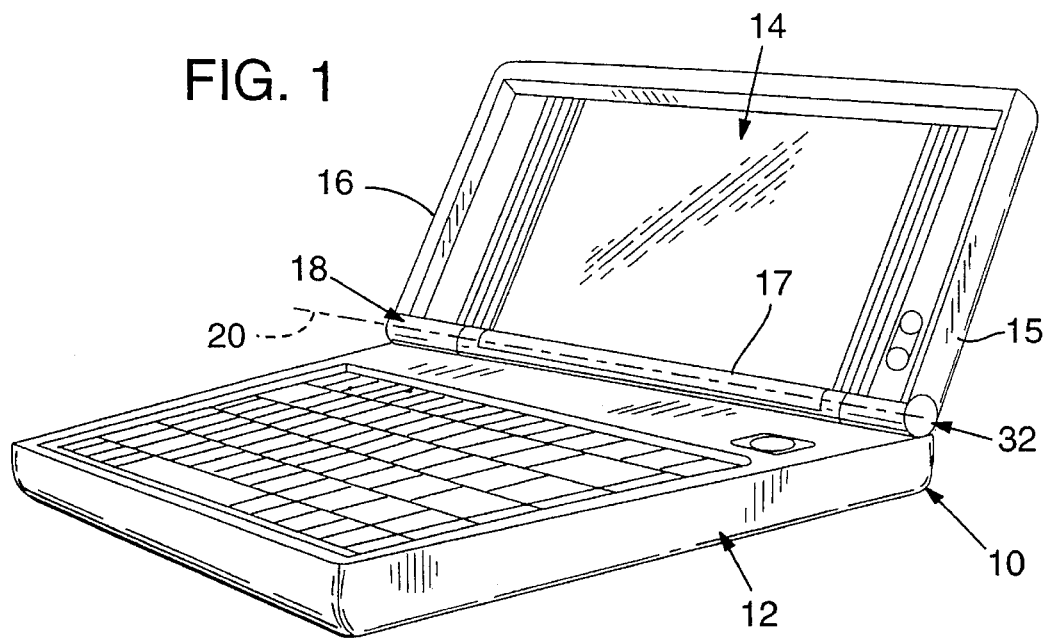
FIG. 1 is a view of a portable computer incorporating hinge assemblies according to an embodiment of the present invention.
Figure 4:
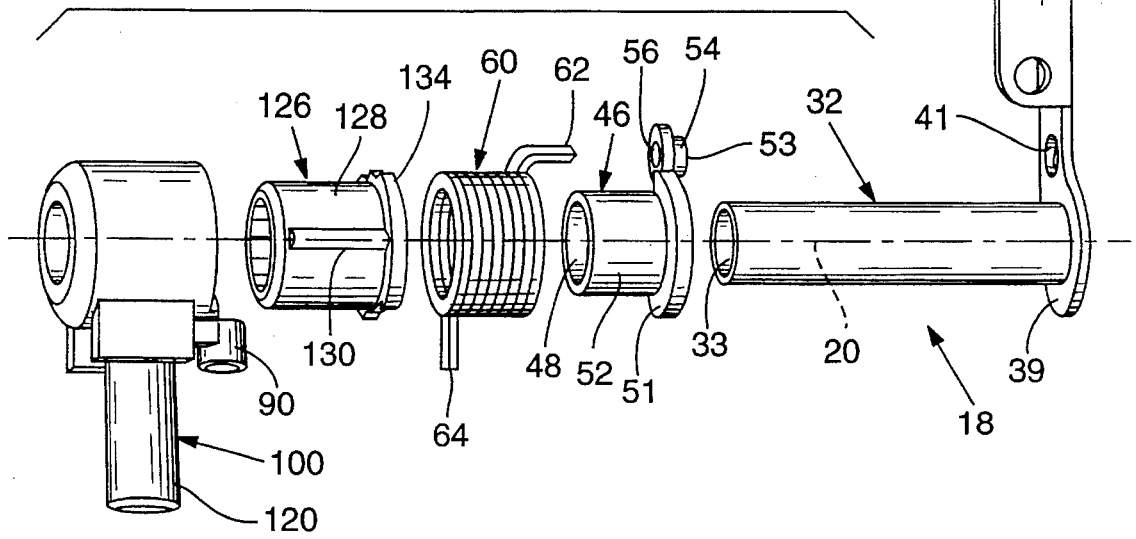
FIG. 4 is an exploded view of a hinge assembly according to the preferred embodiment of the present invention.

Referring to FIG. 1, a device such as a portable computer 10 that incorporates hinge assemblies 18 according to a first embodiment of the present invention includes a base 12 and a display housing 14. The display housing 14 is connected to the base 12 via the hinge assemblies 18. The display housing is rotatable relative to the base about a pivot axis 20 that is concentric with the center line of a pivot shaft 32 as shown in FIG. 4.

Figure 2:
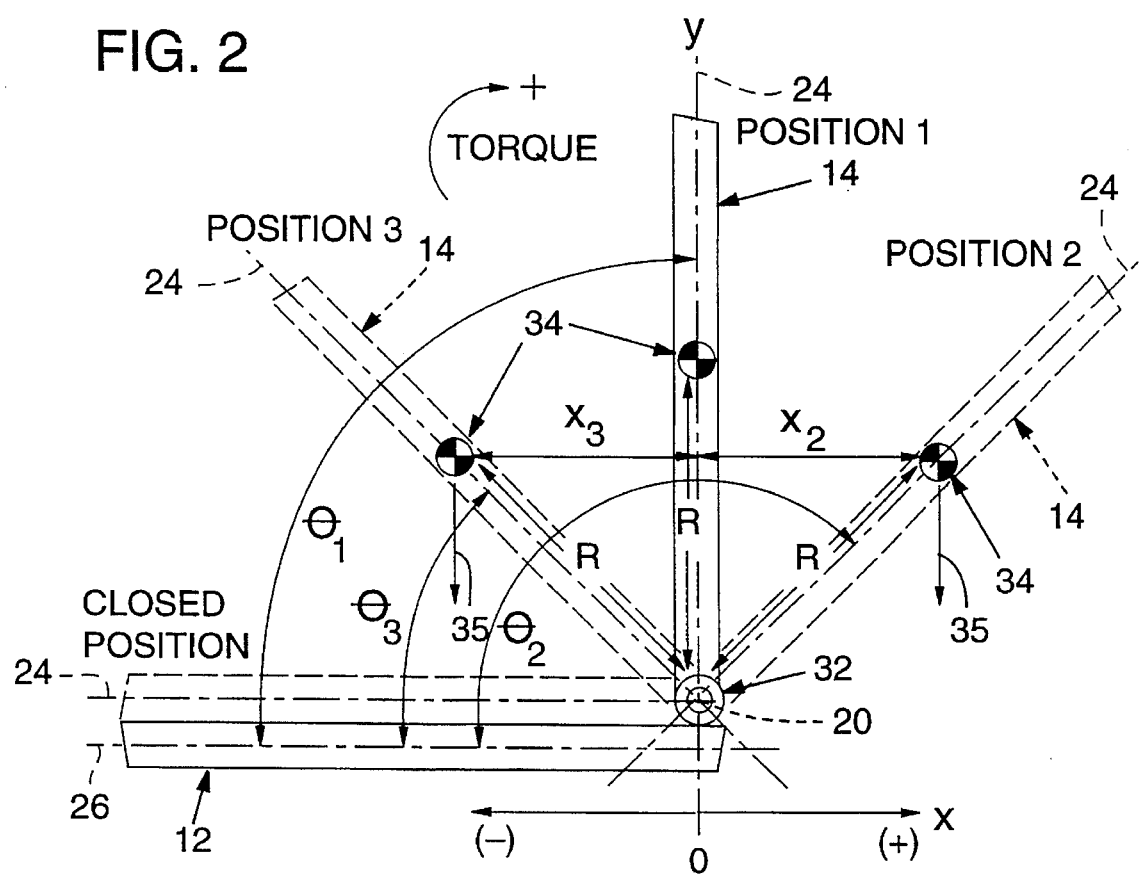
FIG. 2 is a schematic view of the rotation of the display housing relative to the computer base in the embodiment of FIG. 1.

As shown in FIG. 2, the angle θ between the side center line 24 of the display housing 14 and the side center line 26 of the base 12 is 0° when the display housing is in a closed position. In the open position, the user can select the angle θ of the display relative to the base to be any angle, usually within 150°.

The weight of the display housing 14 creates at the hinge assembly 18 a twisting force or torque about the pivot axis 20 (hereinafter called the "display torque"). The torque of concern here is applied in a direction perpendicular to the plane passing through the pivot axis 20 and the point at which the force of the weight 35 of the display housing 14 is applied (hereinafter called the "torque plane").

In general, the torque generated by a force is equal to the magnitude of the force multiplied by the straight line distance between the location where the force is applied and the pivot axis. If a force is applied directly along and toward the pivot axis, then there is no torque applied. An example of a torque created when a force is applied to an object is a wrench used to turn a bolt. A torque has both a magnitude and a direction.

In the case of the display housing 14 attached to the computer base part 12, as shown in FIGS. 1 and 2, the pivot axis 20 passes through and along the centerline of the pivot shaft 32. The force generating the torque is the weight of the display housing. For simplicity of discussion, as shown in FIG. 2, the weight can be represented by a single force applied at the location of the center of mass 34 of display housing 14. The center of mass 34 is shown in FIG. 2 to be located at a distance R from the pivot axis.

For any angular orientation θ of the display housing 14 relative to the base 12, the straight-line distance X between the location of the force and the pivot axis 20 is equal to R multiplied by cos(θ).

Accordingly, when the display housing 14 is in the first position shown in FIG. 2, with an angle $\theta_1$ equal to 90°, there is no torque applied by the weight 35 of the display housing 14 about the pivot axis 20. As mentioned above, a torque is only created when a force is applied at some distance away from and perpendicular to the "torque plane." When the display housing is in the first position, the weight of the display is acting in a direction parallel to the "torque plane," and therefore there is no torque created about the pivot axis.

When the display housing is oriented in the second position as shown in FIG. 2, where the angle between the side center line 24 of the display housing 14 and the side center line 26 of the computer base 12 is greater than 90°, the weight 35 of the display housing 14 creates a clockwise torque about the pivot axis. This torque will hereinafter be referred to as an "opening torque" because it tends to cause the display housing to open relative to the computer base.

When the display housing 14 is in the third position as shown in FIG. 2, a counter-clockwise torque is applied to the pivot axis 20 by the weight 35 of the display housing 14. This torque will hereinafter be referred to as a "closing torque" because it tends to cause the display housing 14 to close relative to the computer base part 12.

Figure 3:
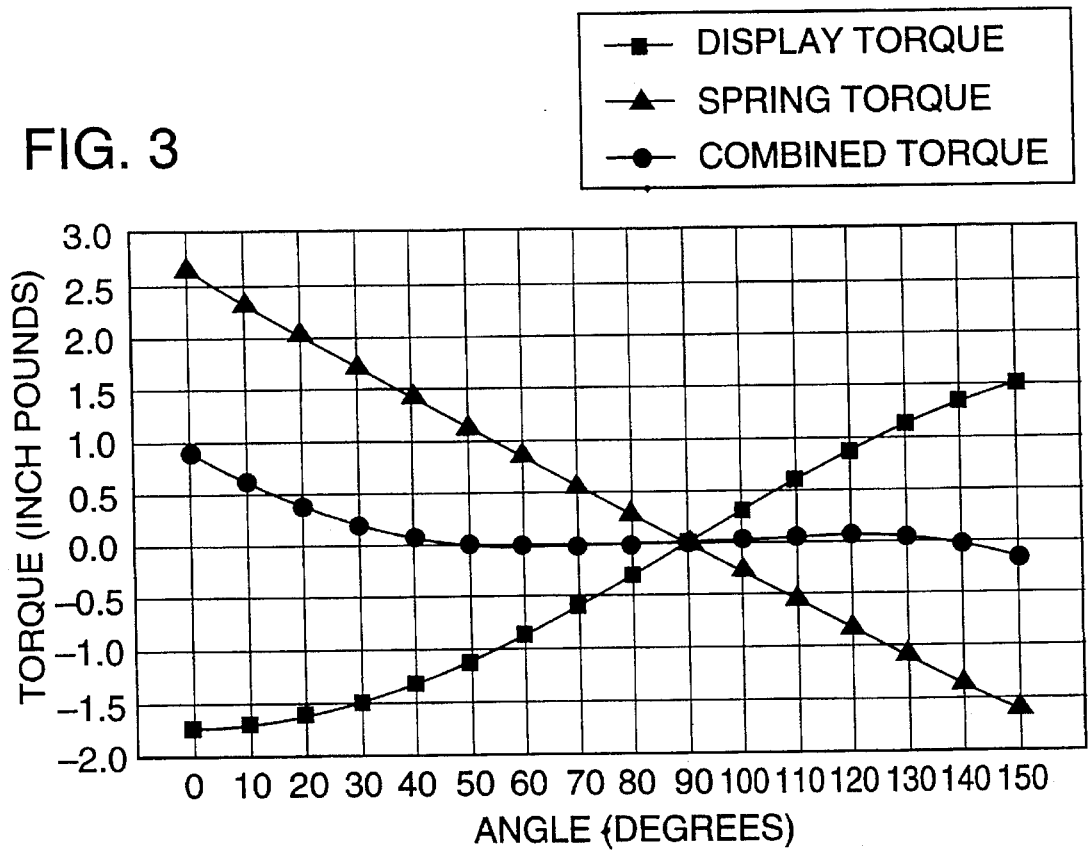
FIG. 3 is a graph of torque vs. angular position of the display housing relative to the computer base according to an embodiment of the present invention.

Therefore, for any angular displacement of the display housing 14 relative to the base part 12, there may be a torque applied to the pivot axis 20 by the weight 35 of the display. This torque varies non-linearly with the angular position of the display housing. For the preferred embodiment, FIG. 3 shows a plot of the display torque vs. angular position of the display housing 14 relative to the base part 12. The plot shows that for angular displacements of the display relative to the base between 0° and 90°, the display torque is negative, for an angular position of 90°, the display torque is 0°, and for angular displacements greater than 90°, the display torque is positive. As noted above, a negative torque is referred to as a closing torque and a positive torque is referred to as an opening torque.

In accordance with the embodiment as shown in FIGS. 1 and 8, the display housing 14 is removably attached to an arm 38 or a similar mechanism. As shown in FIGS. 4, 5, 7 and 11, the arm 38 is fixedly attached to a pivot shaft 32, the center of which is coincident with the pivot axis 20. The pivot shaft 32 may be attached to a mounting feature 40 on the arm 38 or integral to the arm. The arm 38 is attached to the pivot shaft 32 and the display housing 14 as shown in FIG. 1 such that the pivot shaft is perpendicular to the side edges 15 and 16 of the display housing and parallel with the lower edge 17 of the display housing.

Figure 5:
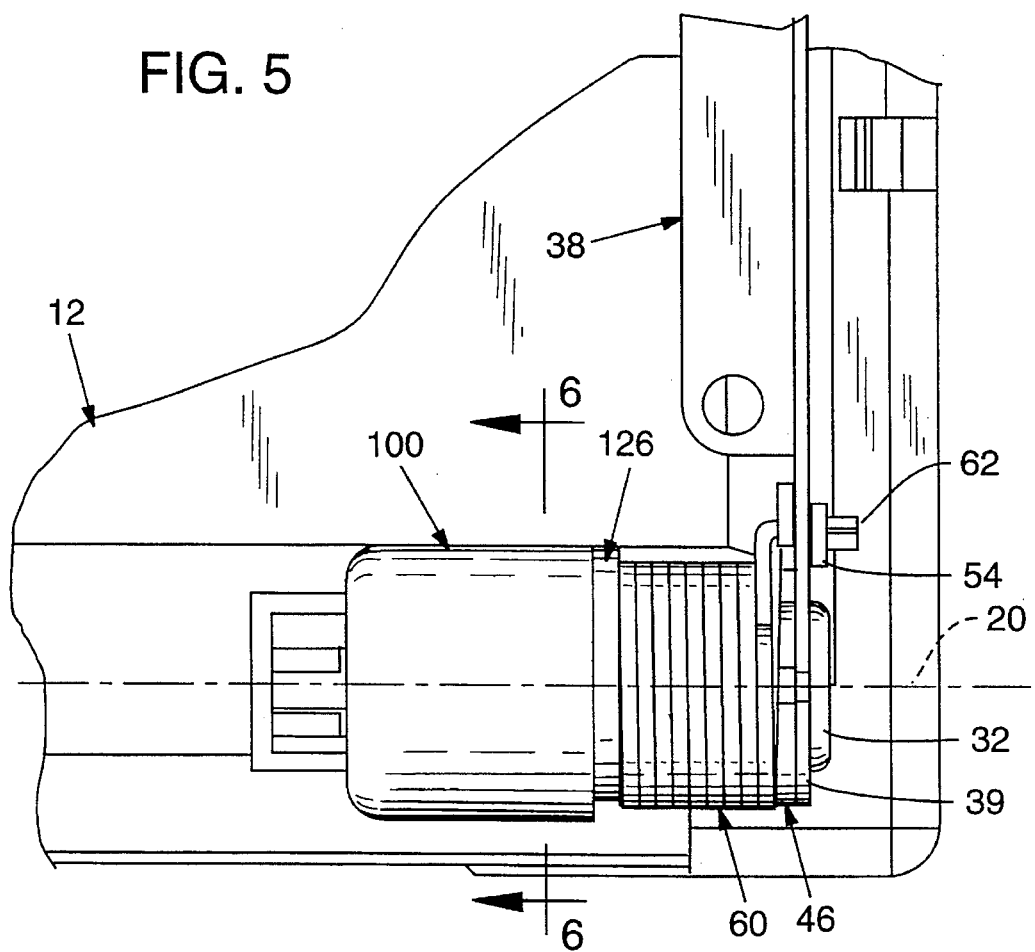
FIG. 5 is a top view of a hinge assembly according to the preferred embodiment of the present invention.
Figure 6:
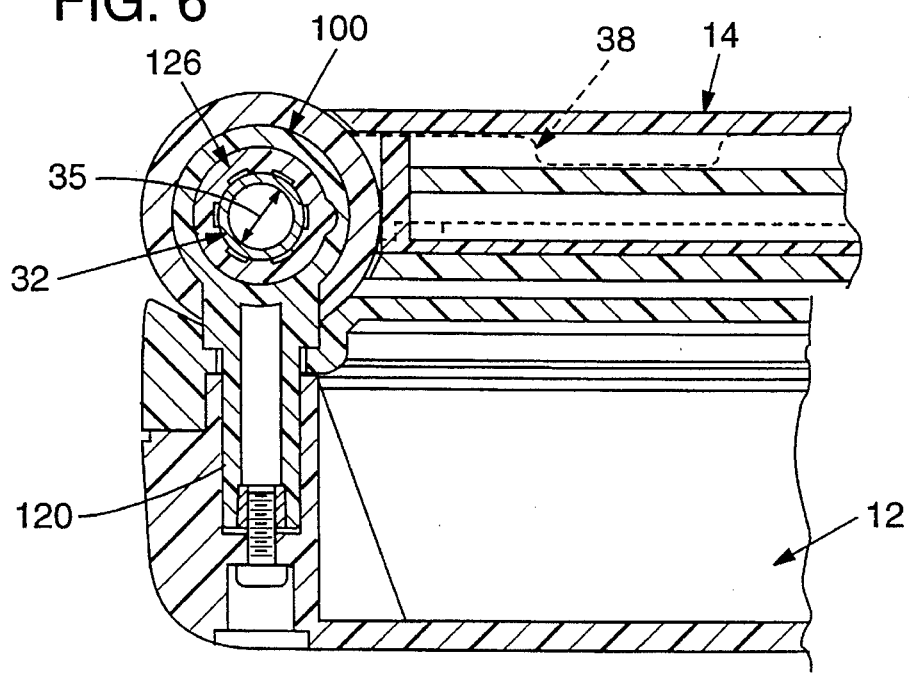
FIG. 6 is a sectional view of the hinge assembly of FIG. 5.

In the preferred embodiment as shown in FIGS. 4, 5 and 6, a spring isolator 46 is slidably engaged with the pivot shaft 32. Spring isolator 46 prevents spring 60 from coming into contact with pivot shaft 32 and support arm 38, thereby preventing wear particles and noise due to metal to metal contact. The spring isolator 46 has an inner cylindrical surface 48 which encompasses the pivot shaft 32 about the circumference of the pivot shaft and along a portion of the length of the pivot shaft.

As shown in FIGS. 13A and 13B, the spring isolator 46 has an outer flange surface 50 protruding radially from the outer cylindrical surface 52. As shown in FIG. 4, when the spring isolator 46 is slidably engaged with the pivot shaft 32, the outer flange surface 50 abuts the inner surface 39 of the arm 38. The inner surface 39 of the arm 38 has an outer flange opening 41 sized to receive the outer surface 54 of a protrusion 53 on the surface 50 of spring isolator 46. When the spring isolator 46 fully slidably engages the pivot shaft 32, the outer surface 54 of the protrusion 53 on the spring isolator slidably engages with the opening 41 in the arm 38, preventing the spring isolator from rotating relative to the arm. The protrusion 53 also has a cavity 56 sized to receive a first end 62 of the torsion spring 60.

The spring isolator 46 has an inner flange surface 51 protruding generally radially from the outer cylindrical surface 52. As shown in FIG. 13B, the inner flange surface 51 has a helical shape to correspond to the helical shape of the first coil 66 of the torsion spring 60. In the preferred embodiment the torsion spring 60 has a shape as shown in FIGS. 15A, 15B and 15C.

A torsion spring 60 is slidably engaged with the spring isolator 46, the inner diameter 68 of the torsion spring 60 is larger than the outer cylindrical surface 52 of the spring isolator to provide clearance between the torsion spring and spring isolator. The surface 67 of the first coil 66 of the torsion spring 60 abuts the inner flange surface 51 of the spring isolator 46. The first end 62 of the torsion spring 60 slidably engages the cavity 56 of the protrusion 53 on the spring isolator 46.

Therefore, when the torsion spring 60 is fully slidably engaged with the spring isolator 46, the first coil 66 of the torsion spring abuts surface 51 on the spring isolator. The inner flange surface 51, by abutting the first coil 66 of the torsion spring 60, constrains and prevents the torsion spring from deflecting along the axial length of the torsion spring. Therefore, compressive and tensile torques applied to the torsion spring will result in circumferential compression and elongation, respectively. The service life of a torsion spring is increased when deflection along the axial length of the torsion spring is avoided.

As the mounting arm 38 is rotated about the pivot axis 20, the pivot shaft 32 and spring isolator 46 remain fixed relative to the mounting arm, and therefore also rotate about the pivot axis. The pivot shaft 32 does not rotate relative to the spring isolator 46. Therefore, the spring isolator 46 acts as a bearing element between the torsion spring 60 and the pivot shaft.

Figure 7:
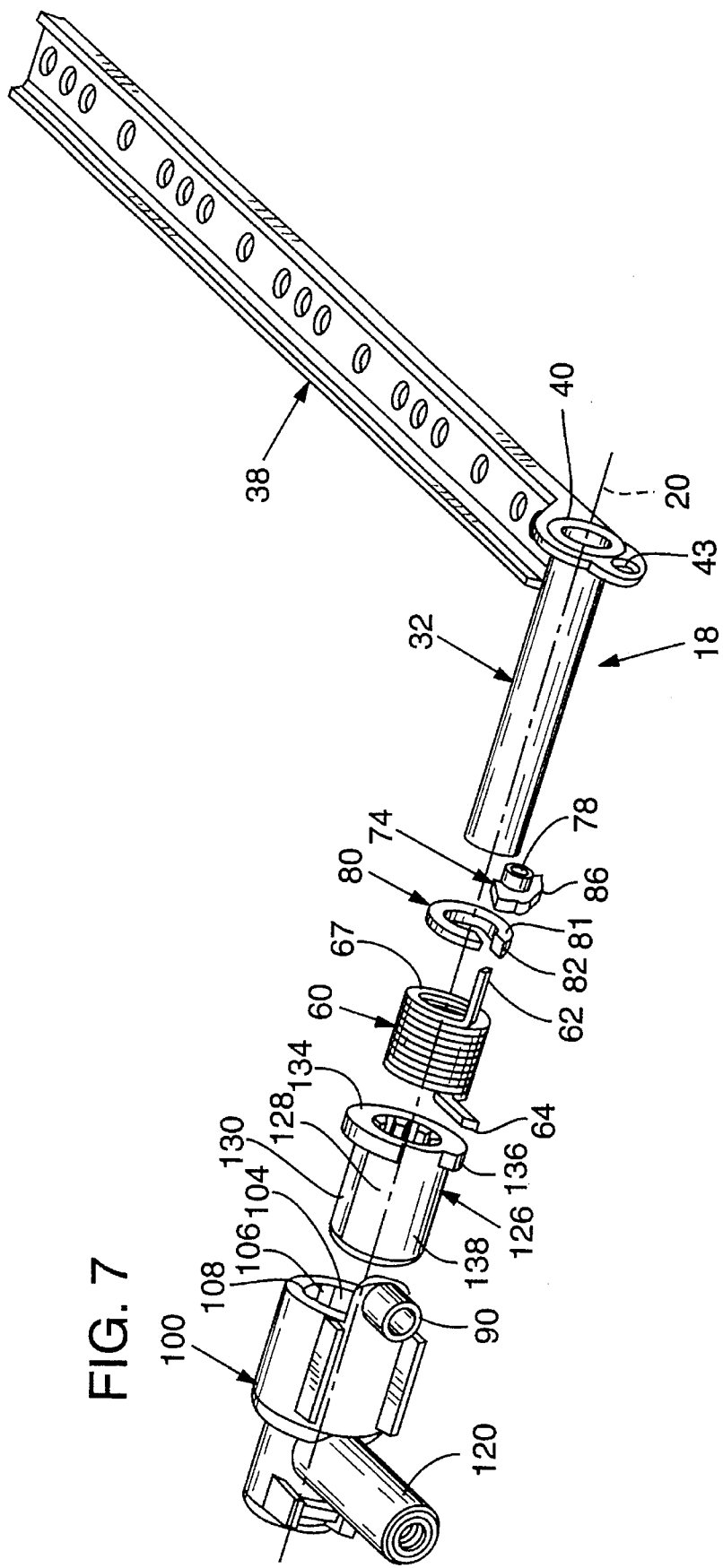
FIG. 7 is an exploded view of a hinge assembly according to an embodiment of the present invention.
Figure 10A:
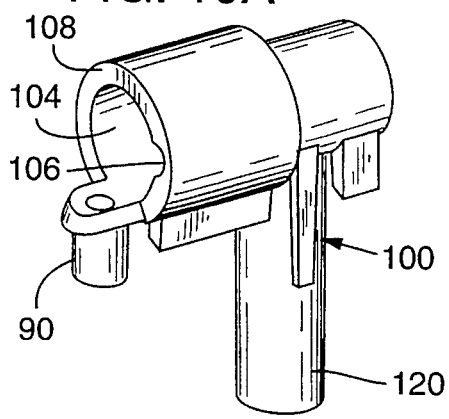
FIGS. 10A and 10B are views of a clutch mechanism according to an embodiment of the present invention.
Figure 10B:
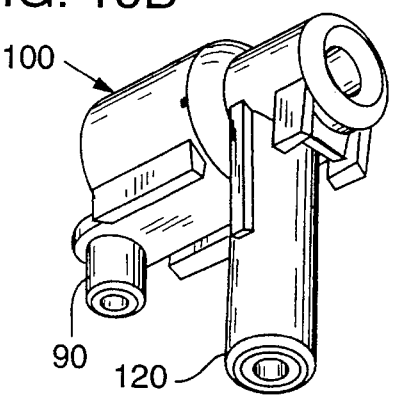
Figure 10C:
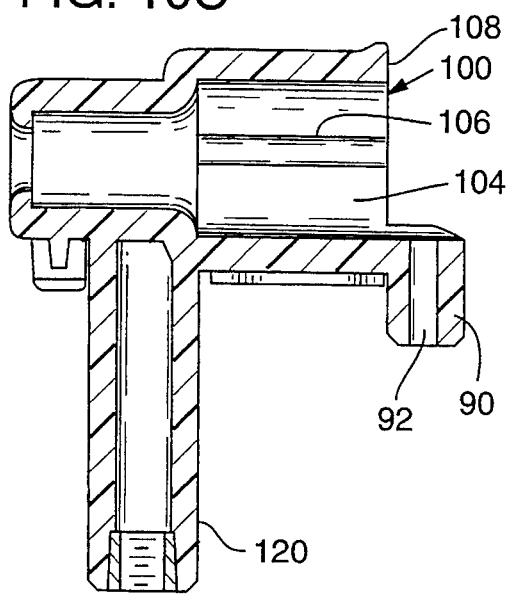
FIG. 10C is a side sectional view of a clutch mechanism according to an embodiment of the present invention.
Figure 10D:
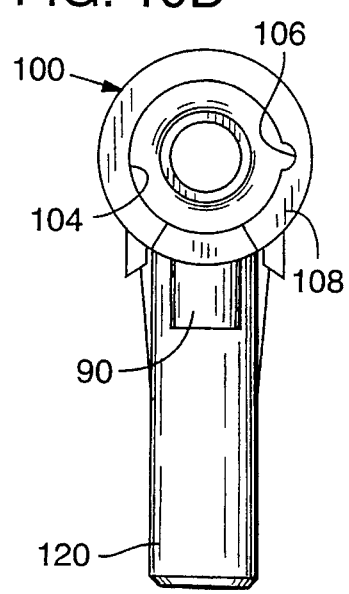
FIG. 10D is an end view of a clutch mechanism according to an embodiment of the present invention.
Figure 11:
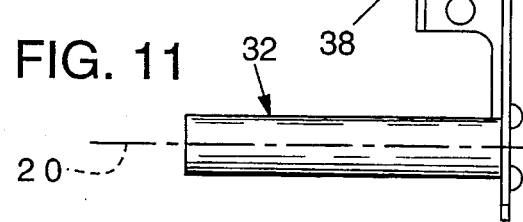
FIG. 11 is a side view of an assembly of a mounting arm and a pivot shaft according to an embodiment of the present invention.

In another embodiment as shown in FIG. 7, the spring isolator 46 is replaced by a spring bushing 74 and a spring support 80. The spring bushing 74 is slidably engaged with an opening 43 in the mounting arm 38 sized to receive the spring bushing. When the spring bushing 74 is fully slidably engaged with the mounting arm 38, the inner surface 86 of the spring bushing abuts the inner surface 39 of the arm.

As shown in FIGS. 14A and 14B, the spring bushing 74 has a cavity 78 sized to receive a first end 62 of the torsion spring 60. The spring bushing 74 is attached to the arm 38 away from the attachment location of the pivot shaft 32 by a distance sufficient to allow the pivot shaft to be engaged with the mounting arm distance sufficient to allow the pivot shaft to be engaged with the mounting arm. When the spring bushing 74 is slidably engaged with the opening 43 in the mounting arm 38, the outer perimeter 75 of the spring bushing abuts the pivot shaft 32.

As shown in FIG. 7, the spring support 80 is slidably engaged with the pivot shaft 32, the inner diameter 84 of the spring support contacting the pivot shaft. In one embodiment, as shown in FIGS. 16A and 16B, the spring support 80 is an annular ring having a C-shape 82. The opening of the C-shape 82 is larger than the outer surface 76 of the spring bushing 74 such that when the spring support 80 is slidably engaged with the pivot shaft 32, the C-shape allows the first surface 81 of the spring support to abut the inner surface 39 of the mounting arm 38.

As shown in FIG. 7, a torsion spring 60 having a first protruding end 62 is slidably engaged with the pivot shaft 32, such that the inner diameter 68 of the torsion spring .contacts the pivot shaft. When the torsion spring 60 is slidably engaged with the pivot shaft 32, the outer surface 67 of the first coil 66 abuts the second surface 83 of the spring support 80. The spring support 80 supports the torsion spring 60 for the same purposes that the spring isolator 46 supported the torsion spring in the preferred embodiment described above. The outer diameter 85 of the spring support 80 may be larger or smaller than the outer diameter 70 of the torsion spring 60.

When the torsion spring 60 is slidably engaged with the pivot shaft 32, the torsion spring must be angularly oriented as shown in FIG. 7 such that the first end 62 of the torsion spring aligns with and passes through the C-shape 82 of the spring support 80, and aligns with the cavity 78 in the spring bushing 74. The first end 62 of the torsion spring 60 slidably engages with the cavity 78 spring bushing 60, preventing the first end of the torsion spring from rotating relative to the spring bushing or arm 38.

As shown in FIGS. 4 and 7, the hinge assemblies 18 include a clutch mechanism 100 which is removably attached to the base part 12 at the attachment boss 120 using one or more screws or similar fasteners. As shown in FIGS. 10A, 10B, 10C and 10D, the clutch mechanism 100 has a generally cylindrical inner surface 104. The inner surface 104 has a keyway 106 which extends along the length of the inner surface. The clutch mechanism 100 also has a second spring bushing 90 with a cavity 92 sized to receive the second end 64 of the torsion spring 60. In the preferred embodiment, the second spring bushing 90 is located perpendicularly to the inner surface 104 of the clutch mechanism 100.

In the preferred embodiment, the second end 64 of the torsion spring 60 is fixed relative to the base part 12, by slidably engaging the second end 64 of the torsion spring 60 into a cavity 92 in a second spring bushing 90 attached to or integral with the clutch mechanism 100. Once slidably engaged into the second spring bushing 90, the second end 64 of the torsion spring 60 is angularly fixed relative to the clutch mechanism 100 and the base part 12.

As shown in FIGS. 5, 6, 7 and 8, a friction bushing 126 is slidably engaged with the clutch mechanism 100. As shown in FIGS. 12C and 12D, the friction bushing 126 has a generally cylindrical outer surface 128 having a key 130 protruding radially from and extending along the length of the outer surface. The cross-section of the key 130 may be any convenient shape for slidably engaging the key with the keyway 106 in the clutch mechanism 100. The outer surface 128 of the friction bushing 126 is slightly smaller than the inner surface 104 of the clutch mechanism 100. When the friction bushing 126 is slidably engaged with the clutch mechanism 100, the key 130 in the friction bushing slidably engages the keyway 106 in the clutch mechanism to prevent angular displacement of the friction bushing relative to the clutch mechanism.

The friction bushing 126 has a flange 134 which protrudes radially from the outer surface 128 of the friction bushing at a first end 136 away from a second end 138, which is first inserted into the clutch housing. The flange 134 has an inner surface 135 which abuts an outer surface 108 of the clutch mechanism 100 when the friction bushing 126 is slidably engaged with the clutch mechanism. The flange 134 acts as a stop to prevent the friction bushing 126 from being inserted too far into the clutch mechanism 100.

Figure 12A:
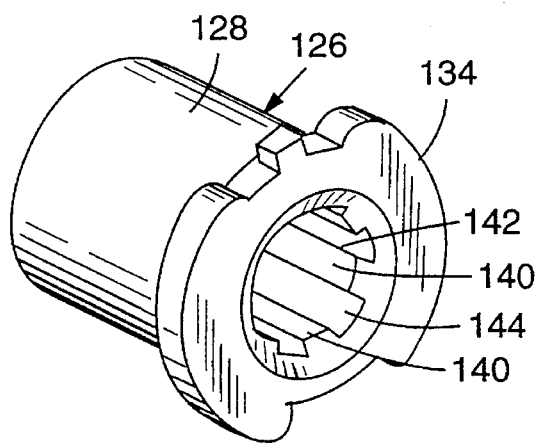
FIGS. 12A and 12B are views of a friction bushing according to an embodiment of the present invention.
Figure 12B:
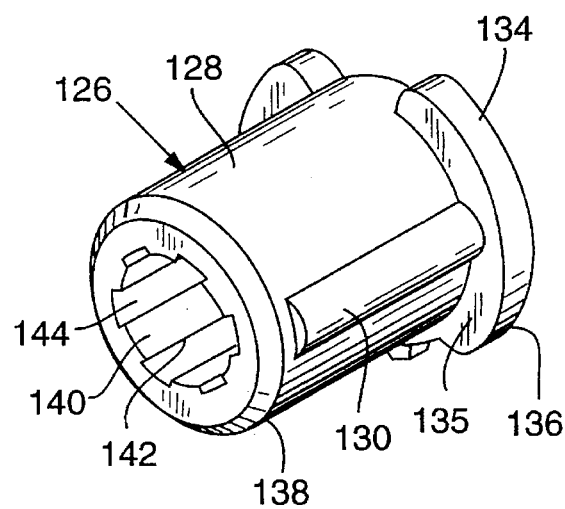
Figure 12C:
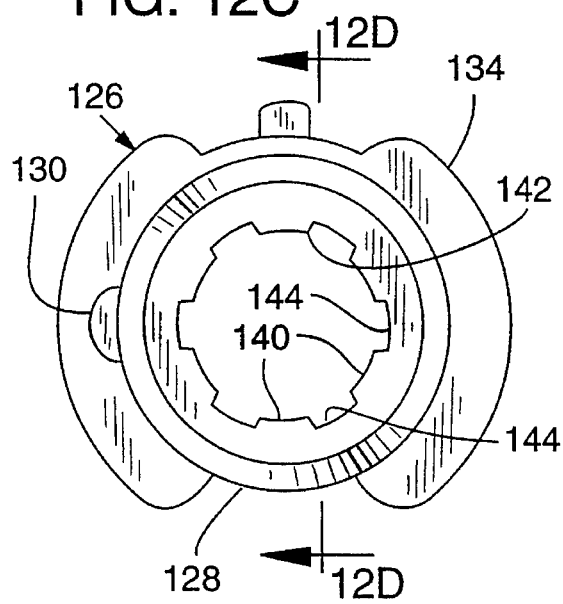
FIG. 12C is an end view of a friction bushing according to an embodiment of the present invention.
Figure 12D:
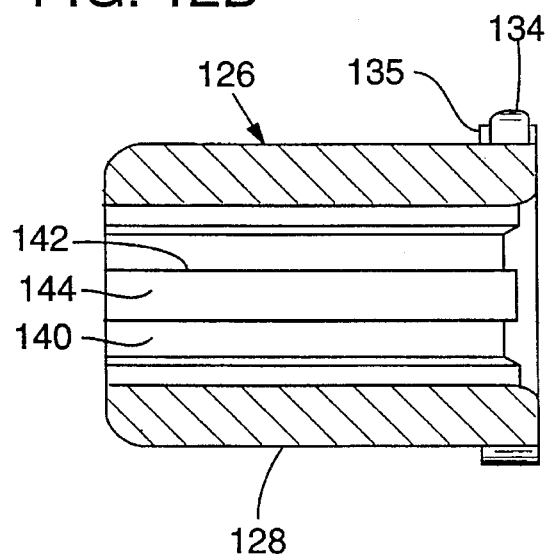
FIG. 12D is a side, sectional view of the friction bushing of FIG. 12C according to an embodiment of the present invention.

As shown in FIGS. 12A and 12B, the friction bushing 126 also has a first inner surface 140 which is generally cylindrical, having a plurality of grooves or splines 142 along the length of the first inner surface, the depth of which form a second inner surface 144 having a radius larger than the first inner surface by an amount equal to the depth of the splines. In the preferred embodiment, the first inner surface 140 of the friction bushing 126 is smaller than the diameter of the pivot shaft 32 by about 0.01 inches.

The pivot shaft 32 is slidably engaged with the friction bushing 126, using a press fit. Frictional forces between the inner surface 140 of the friction bushing 126 and the pivot shaft 32 are generated as the pivot shaft is rotated relative to the friction bushing.

In related embodiments, the diameter of the inner surface 140 of the friction bushing 126 or the pivot shaft 32 may be changed to increase or decrease the amount of interference and therefore the amount of friction between the first inner surface of the friction bushing and the pivot shaft.

Figure 9:
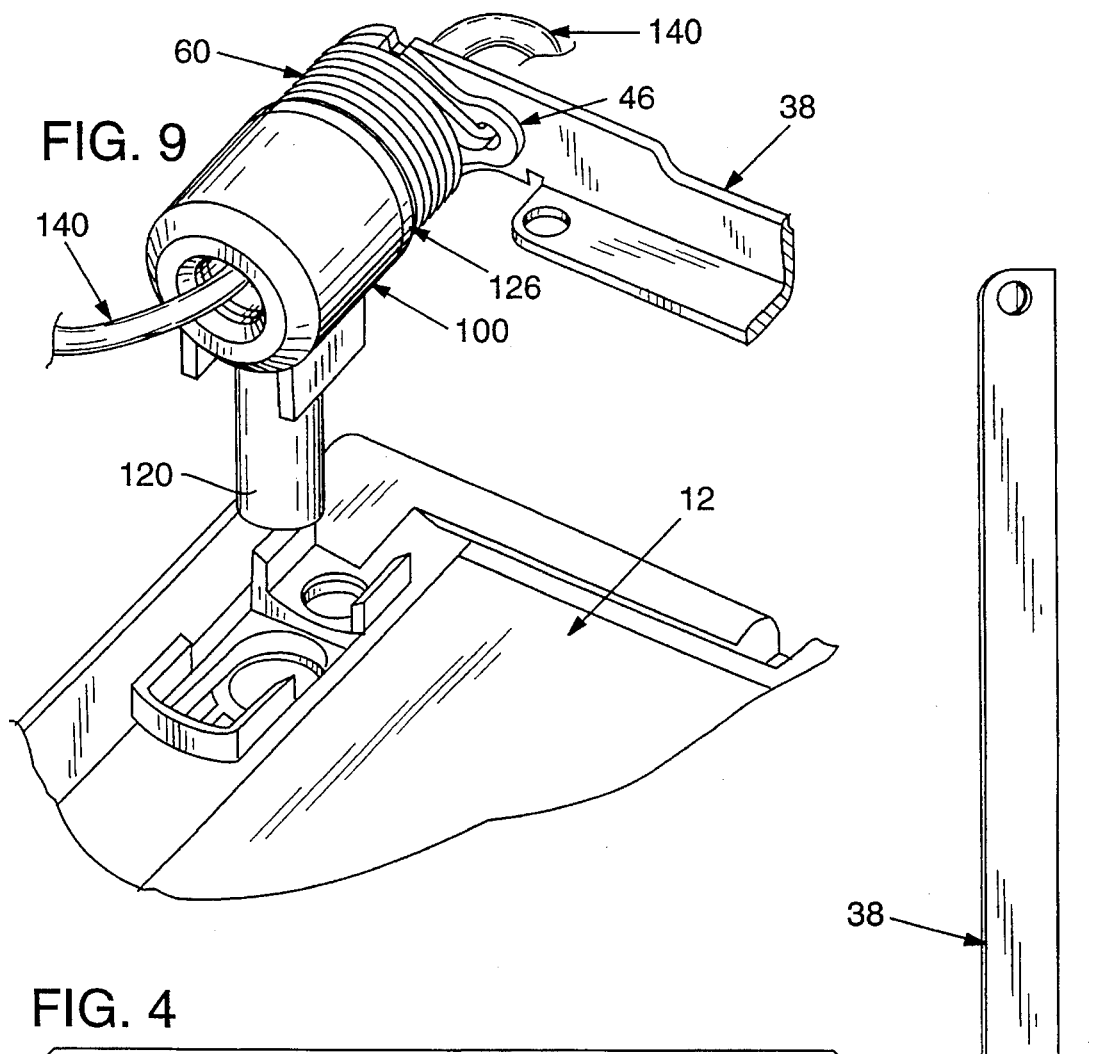
FIG. 9 is a view of a hinge assembly detail showing how the hinge assembly is installed into the computer base part.

As shown in FIGS. 4, 7 and 9, as the arm 38 attached to the display housing 14 is rotated relative to the base part 12, the first end 62 of the torsion spring 60 is rotated relative to the second end 64 of the torsion spring. This rotation generates a rotational torque upon the torsion spring 60. In response to this torque, the torsion spring 60 will generate a rotational torque in the opposite direction equal to the angular displacement of the torsion spring multiplied by the spring constant of the torsion spring (hereinafter called a "spring torque").

In the preferred embodiment, the "spring torque" varies substantially linearly with (i.e. in proportion to) the angular displacement of the display housing 14 relative to the base part 12. In FIG. 3, the magnitude and direction of the spring torque is plotted for any angular orientation of the display housing 14 relative to the base 12.

In the preferred embodiment, as shown in FIG. 3, the torsion spring 60 is under no tensile or compressive stress when the angular displacement of the display housing 14 relative to the base part 12 is 90°. When the angle of the display housing 14 relative to the base part 12 is less than 90°, a tensile or stretching stress is applied to the torsion spring 60, resulting in an "opening torque" applied to the pivot shaft 32. When the angle between the display housing 14 and the base 12 is greater than 90°, a compressive stress is applied to the torsion spring 60, resulting in a "closing torque" applied to the pivot shaft 32.

In general, when more than one torque acts upon a single axis, the torques may be added to one another to determine the resultant or net torque applied to the pivot axis. In the preferred embodiment, as shown in FIG. 3, the torsion spring 60 is selected such that its spring constant provides a torque which, when combined with the torque generated by the display housing 14 weight, results in a combined torque as shown in FIG. 3.

The graph in FIG. 3 shows that for an angular orientation of the display housing 14 relative to the base part 12 of between 50° and 140°, the combined torque upon the pivot shaft 32 is nearly 0. The maximum combined torque upon the pivot shaft 32 over this range is 0.04 inch-pounds. Over the range of 40° to 150°, the combined torque is still very low, reaching a maximum magnitude of 0.12 inch-pounds. For angular displacements of the display housing 14 relative to the base part 12 of between 0° and 40°, the combined torque is an "opening torque" which varies between a maximum of 0.9 inch-pounds when the angle between the display housing 14 and the base part 12 is 0°, to a minimum of 0.2 inch-pounds when the angle between the display housing and the base part is 40°.

Therefore, in order to fully close the display housing, a user must exert a closing torque on the pivot shaft 32 to overcome the combined "opening torque." The combined "opening torque" existing when the display is in the closed position further provides a "pop-up" feature such that when the latch holding the display housing closed against the base is released, the display housing angularly deflects or pops-up a distance sufficient to assist the user in grasping the display.

In related embodiments, a torsion spring 60 may be selected that has a different spring constant to provide more or less spring torque for a given angular displacement of the display housing 14 relative to the base 12. Such a selection would produce a different combined torque for a given angular position of the display housing 14.

The function of the clutch mechanism 100 is to provide rotational friction to the movement of the display housing 14 relative to the base part 12. When the "display torque" and the "spring torque" are nearly equal, the display housing 14 will be in a state of near equilibrium, meaning that only a slight force will be required to adjust the display housing. The friction created by the clutch mechanism 100 is desirable to allow the display housing to remain in the angular position desired by the user.

In the preferred embodiment as shown in FIGS. 4, 6, 7, 8 and 9, the pivot shaft 32 is hollow having a generally cylindrical inner surface 33. The diameter 35 of the inner surface 33 is large enough to allow a cable 140 or wiring harness or the like to press through the pivot shaft 32. The cable 140 may be used to provide electrical signals grounding, shielding or the like from the base part 12 to the display housing 14. By passing the cable 140 through the pivot shaft 32, as the display housing 14 is rotated relative to the base part 12, the cable undergoes torsional strain, but does not undergo strain perpendicular to its length. Cables or wires are highly susceptible to fatigue when subjected to crimping or bending forces. Therefore, by providing a channel to constrain the wire and subject the wire primarily to torsional strain, the service life of the wire will be increased.

In view of the many possible embodiments to which the principles of our invention may be put, it should be recognized that the detailed embodiments are illustrative only and should not be taken as limiting the scope of our invention. For example, while device 10 is shown as a portable computer device, any device with a hinged display, such as a medical device, calculator, photo copier control panel, etc, would fall within the spirit and scope of this invention. Rather, we claim as our invention all such embodiments as may come within the scope and spirit of the following claims and equivalents thereto.

We claim:

1. A portable computer having a display housing and a base attached to the display housing by a hinge assembly, the hinge assembly comprising:

a pivot shaft attaching the display housing to the base and allowing the display housing to pivot relative to the base, the display housing generating a first torque on the pivot shaft in proportion to the angular orientation of the display housing;

a coil torsion spring for providing a second torque on the pivot shaft in proportion to the angular orientation of the display housing, the spring surrounding at least a portion of the pivot shaft, the spring having a first end and a second end;

a mechanism for constraining the first end of the torsion spring relative to the housing; and a clutch mechanism having a first inner surface for slidably engaging the pivot shaft, the first inner surface of the clutch mechanism being sized to fit tightly around the pivot shaft so as to continuously resist rotation of the pivot shaft, a mechanism for constraining the second end of the torsion spring, and a mechanism removably attaching the clutch mechanism to the base.

2. The portable computer of claim 1 wherein for any angular orientation of the display housing between 0° and 150° relative to the base, the sum of the torque provided by the display and the torque provided by the spring does not exceed 1.0 inch-pounds.

3. The portable computer of claim 1 wherein for any angular orientation of the display housing between 50° and 140° relative to the base, the sum of the torque provided by the display and the torque provided by the spring does not exceed 0.1 inch-pounds.

4. The portable computer of claim 1 including a clutch mechanism having a first inner surface with a plurality of grooves, the first inner surface for providing rotational friction.

5. The portable computer of claim 1 wherein the pivot shaft has an axis and an inner surface of a diameter sized to allow a cable to slide along the axis of the pivot shaft.

6. A portable computer having a base and a display housing attached to the base by a hinge assembly, the hinge assembly comprising:

an arm removably attached to the display housing;

a pivot shaft attached to the arm, extending perpendicular to the arm;

a torsion spring having a first end and a second end, the torsion spring slidably engaged with the pivot shaft;

a mechanism for constraining the first end of the torsion spring relative to the arm;

a clutch mechanism having a first inner surface for slidably engaging the pivot shaft, the first inner surface of the clutch mechanism being sized to fit tightly around the pivot shaft so as to continuously resist rotation of the pivot shaft, a mechanism for constraining the second end of the torsion spring, and a mechanism for removably attaching the clutch mechanism to the base;

whereby the display housing may be rotated to a selectable angular position and remain in the selected position.

7. The portable computer of claim 6 wherein the first end of the torsion spring protrudes axially from the torsion spring.

8. The portable computer of claim 6 in which the selectable angular position is selectable from the range of at least 50 degrees to 140 degrees.

9. The portable computer of claim 6 further comprising a bearing element slidably engaged with the pivot shaft and the torsion spring.

10. The portable computer of claim 6 wherein the pivot shaft has an inner diameter sized to allow a cable to be slidably engaged with the pivot shaft.

11. A portable computer comprising:

a base;

a display; and a hinge coupling the display to the base, the hinge including a pivot shaft coupled to the display, a coiled torsion spring that tends to urge the display relative to the base so as to exert a force therebetween, the spring having a first end and a second end, the spring slidably engaged with the pivot shaft, a mechanism for constraining the first end of the torsion spring relative to the display, a clutch mechanism coupled to the base and having a first inner surface for slidably engaging the pivot shaft, the first inner surface of the clutch mechanism being sized to fit tightly around the pivot shaft so as to continuously resist rotation of the pivot shaft, and a mechanism for constraining the second end of the torsion spring.

12. The computer of claim 11 in which:

the base and display define a base-display angle; and a torque exerted by the torsion spring on the display substantially matches a second torque exerted by gravity on the display, when the base is horizontal, for a range of base-display angles.

13. The computer of claim 11 in which said range spans at least 40 degrees.

14. The computer of claim 11 in which said range of base-display angles is from about 50 to about 140 degrees.

15. The computer of claim 11 in which the hinge additionally includes a mechanism having a first inner surface with a plurality of grooves, the first inner surface for providing rotational friction.

* * * * *